US008561270B2

(12) United States Patent
Suarez et al.

(10) Patent No.: US 8,561,270 B2
(45) Date of Patent: Oct. 22, 2013

(54) COMPOSITE CERAMIC STRUCTURE AND METHOD OF MAKING THE SAME

(75) Inventors: Marshall Suarez, Albuquerque, NM (US); Steve Kear, Albuquerque, NM (US)

(73) Assignee: CTS Corporation, Elkhart, IN (US)

( * ) Notice: Subject to any disclaimer, the term of this patent is extended or adjusted under 35 U.S.C. 154(b) by 308 days.

(21) Appl. No.: 13/028,346

(22) Filed: Feb. 16, 2011

(65) Prior Publication Data
US 2011/0206888 A1    Aug. 25, 2011

Related U.S. Application Data

(60) Provisional application No. 61/338,718, filed on Feb. 22, 2010.

(51) Int. Cl.
*H01L 41/22* (2013.01)
*H01L 41/09* (2006.01)

(52) U.S. Cl.
USPC ............................... 29/25.35; 310/334

(58) Field of Classification Search
USPC ................. 310/334, 340, 367; 29/25.35
See application file for complete search history.

(56) References Cited

U.S. PATENT DOCUMENTS

| 4,514,247 | A |   | 4/1985  | Zola              |         |
|-----------|---|---|---------|-------------------|---------|
| 4,628,223 | A | * | 12/1986 | Takeuchi et al.   | 310/358 |
| 4,683,396 | A | * | 7/1987  | Takeuchi et al.   | 310/358 |
| 4,732,717 | A |   | 3/1988  | Yanagida et al.   |         |
| 5,327,895 | A | * | 7/1994  | Hashimoto et al.  | 600/459 |
| 5,357,662 | A |   | 10/1994 | Takagi et al.     |         |
| 5,359,760 | A | * | 11/1994 | Busse et al.      | 29/25.35 |
| 5,376,859 | A | * | 12/1994 | Kim et al.        | 310/334 |
| 5,504,980 | A |   | 4/1996  | Yoshinaga et al.  |         |
| 5,623,236 | A |   | 4/1997  | Yoshinaga et al.  |         |
| 5,729,239 | A |   | 3/1998  | Rao               |         |
| 5,830,591 | A |   | 11/1998 | Sengupta et al.   |         |
| 6,088,894 | A | * | 7/2000  | Oakley et al.     | 29/25.35 |

(Continued)

FOREIGN PATENT DOCUMENTS

| WO | WO 00/24080    | 4/2000 |
| WO | WO 2009/055767 | 4/2009 |

OTHER PUBLICATIONS

Zhen Yuhua et al: "Preparation and electrical properties of fine-scale 1-3 lead zirconic titanate/epoxy composite thick films for high-frequency ultrasonic transducers", Journal of Applied Physics, American Institute of Physics. New York, US LNKD-DOI:10.1063/1.2903456, vol. 103, No. 8, Apr. 25, 2008, pp. 84119(1)-84119(4), XP012110617 ISSN: 0021-8979 pp. 084119-1, col. 2, paragraph 3—pp. 084119-2, col. 1, paragraph 1 figure 1.

*Primary Examiner* — Thomas Dougherty
(74) *Attorney, Agent, or Firm* — Daniel J. Deneufbourg

(57) ABSTRACT

A composite ceramic structure such as, for example, a PZT ceramic structure including, in one embodiment, a plurality of ceramic elements encapsulated in a layer of epoxy material. Each of the ceramic elements includes opposed first and second ends terminating in opposed respective top and bottom surfaces of the composite ceramic structure. A layer of conductive material on the top surface of the composite ceramic structure covers only the respective first ends of the ceramic elements to isolate the same from each other. A layer of conductive material covers the entire bottom surface of the composite ceramic structure to ground the opposed second ends of the plurality of ceramic elements to each other. A method of making the composite ceramic structure described above is also disclosed.

4 Claims, 5 Drawing Sheets

(56) References Cited

U.S. PATENT DOCUMENTS

| | | |
|---|---|---|
| 6,393,681 B1 | 5/2002 | Summers |
| 6,538,363 B2 * | 3/2003 | Nagahara et al. ............. 310/334 |
| 6,620,287 B2 * | 9/2003 | Cass ............................ 156/296 |
| 6,703,767 B1 | 3/2004 | Summers |
| 6,844,861 B2 | 1/2005 | Peterson |
| 6,925,693 B2 | 8/2005 | Takeuchi et al. |
| 7,082,655 B2 | 8/2006 | Yetter et al. |
| 7,096,547 B2 | 8/2006 | Yun et al. |
| 7,109,642 B2 | 9/2006 | Scott |
| 2001/0042291 A1 | 11/2001 | Esashi et al. |
| 2003/0137223 A1 | 7/2003 | Kitajima et al. |
| 2007/0228871 A1 | 10/2007 | Aoki et al. |
| 2009/0021857 A1 | 1/2009 | Shelor |
| 2009/0058230 A1 | 3/2009 | Kear et al. |
| 2009/0062656 A1 * | 3/2009 | Hyuga .......................... 600/459 |
| 2009/0085440 A1 * | 4/2009 | Nakamura .................... 310/334 |
| 2009/0108708 A1 * | 4/2009 | Jiang et al. .................... 310/334 |
| 2011/0020585 A1 * | 1/2011 | Steinfeldt et al. ............... 428/70 |
| 2011/0163636 A1 * | 7/2011 | Sirbuly et al. ................. 310/339 |

\* cited by examiner

COMPOSITE CERAMIC STRUCTURE AND METHOD OF MAKING THE SAME

CROSS-REFERENCE TO RELATED APPLICATIONS

This application claims the benefit of the filing date and disclosure of U.S. Provisional Application Ser. No. 61/338,718, filed on Feb. 22, 2010 and which is explicitly incorporated herein by reference as are all references cited therein.

FIELD OF THE INVENTION

This invention relates to ceramic elements and, more specifically, to a composite micro actuation PZT (lead zirconate titanate) ceramic structure and the method of making the same.

BACKGROUND OF THE INVENTION

PZT (lead zirconate titanate) ceramic elements are used in a variety of applications including, for example, in the micro positioning or actuation of the read/write heads of computer disk drives. This micro actuation application has traditionally utilized two individual and separate PZT elements. Recently, however, a need has arisen for a one PZT element solution in micro actuation applications in an effort to decrease not only the cost of the PZT elements but also to simplify the disk drive manufacturing and assembly process.

One approach which has been considered for a one PZT element solution is the use of a photolithographic process including the steps of metallizing and then poling opposite ends of a one piece PZT element to mimic a two PZT element solution. The poling of a one piece PZT element in opposite directions, however, has the disadvantage of creating structural stresses in the middle portion of the PZT element which, in turn, increases the risk of breakage of the PZT element.

SUMMARY OF THE INVENTION

The present invention is directed to a composite ceramic structure which, in one embodiment, is comprised of first and second opposed surfaces and a body including a plurality of spaced-apart PZT elements encapsulated in a layer of encapsulation material. Each of the PZT elements includes opposed first and second ends which terminate in the first and second opposed surfaces respectively. A first layer of conductive material covers the first surface and grounds the first ends of the PZT elements. A second layer of conductive material covers only the second ends of the respective PZT elements to isolate the second ends of the PZT elements.

In one embodiment, the PZT elements may be encapsulated in the composite structure in either a 1×2 or 2×2 matrix configuration.

The method of making the composite ceramic structure described above includes, in one embodiment, the following steps: providing a wafer of ceramic material including opposed first and second surfaces; making a plurality of cuts through the wafer to form a wafer including a base and a plurality of spaced-apart ceramic elements extending away from the base and defining a plurality of spaced-apart recesses surrounding the plurality of ceramic elements; filling the plurality of recesses with an encapsulation material; grinding away a portion of the first and second opposed surfaces of the wafer to expose first and second opposed ends of the plurality of ceramic elements which terminate in the first and second surfaces of the wafer; covering the first surface of the wafer with a layer of conductive material to ground the second ends of the plurality of ceramic elements; covering only the second ends of the plurality of ceramic elements with a layer of conductive material to isolate the first ends of the plurality of ceramic elements; poling the wafer; and making one or more cuts through the encapsulation material to form the composite ceramic structure.

There are other advantages and features of this invention, which will be more readily apparent from the following detailed description of preferred embodiments of the invention, the drawings, and the appended claims.

BRIEF DESCRIPTION OF THE FIGURES

These and other features of the invention can best be understood by the following description of the accompanying drawings as follows.

DETAILED DESCRIPTION OF THE EMBODIMENTS AND METHOD OF THE INVENTION

Figure 1:
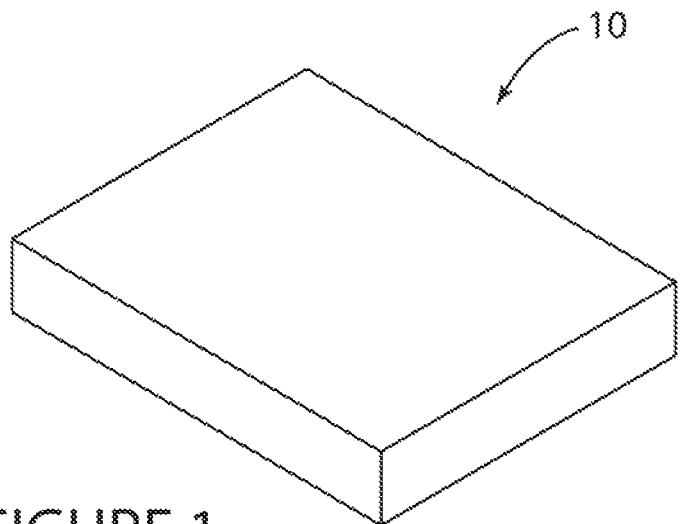
FIG. 1 is an enlarged perspective view of a wafer of PZT ceramic material which can be used as a starting material for making the composite PZT ceramic structure of the present invention.

FIG. 1 shows a wafer 10 of PZT (lead zirconate titanate) ceramic material which can be used as the starting material for making a plurality of the composite PZT ceramic structures of the present invention.

Although not shown or described herein in any detail, it is understood that the wafer 10 is made by providing a solid block of PZT ceramic material having a dimension (length, height, width) substantially larger than the dimension (length, height, width) of the final desired composite PZT structure.

Figure 2:
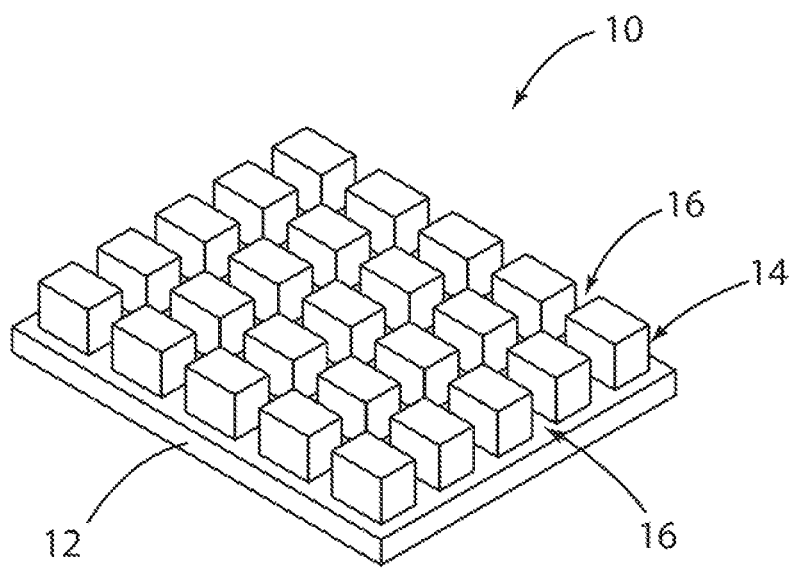
FIG. 2 is an enlarged perspective view of the PZT ceramic wafer of FIG. 1 after it has been diced.

The wafer 10, which in one embodiment may be about 76 mm long, 1 mm high, and 76 mm wide, is mounted on a dicing tape and initially diced (cut) to form a wafer 10 as shown in FIG. 2 which includes a solid base 12 and a plurality of spaced-apart, parallel, and elongated pillars or columns or elements 14 of PZT material extending generally unitarily normally outwardly and upwardly from the base 12 and positioned on the base 12 in a series of respective co-linear and parallel series of columns and rows. FIG. 2 depicts a wafer 10 with five respective co-linear and parallel series of columns and rows of PZT elements 14. A plurality of open channels or recesses 16 are located between and surround each of the individual PZT elements 14.

As described in more detail below, each of the PZT elements 14 will define the elements of the final composite PZT ceramic structure of the present invention and thus the wafer 10 is diced with a blade whose width and orientation during dicing will determine the pitch of the PZT elements 14; the pitch of the composite PZT structure; and the thickness of the layer(s) of encapsulation material on the composite PZT structure.

For example, the use of a wide dicing blade during the initial dicing operation will result in a thicker layer of epoxy or the like encapsulation material on the composite PZT structure, while the use of a thinner dicing blade during this initial dicing operation will result in a composite PZT structure with a thin layer of epoxy or the like encapsulation material.

The pitch of each of the PZT elements 14 in both the X and Y directions is determined by the following equation:

Pitch=poled shrinkage factor×(final dimension+final kerf)

The width of the dicing blade or cut for this initial processing operation is determined by the following equation:

First blade or cut width=Final blade or cut width+(2× remaining epoxy)

If PZT material is to be removed, then remaining epoxy=− (PZT to remove on the side).

Although not described herein in any detail, it is understood that the invention encompasses the use of any other suitable cutting apparatus to effect the initial cuts in the wafer 10 such as, for example, the use of a laser.

Figure 3:
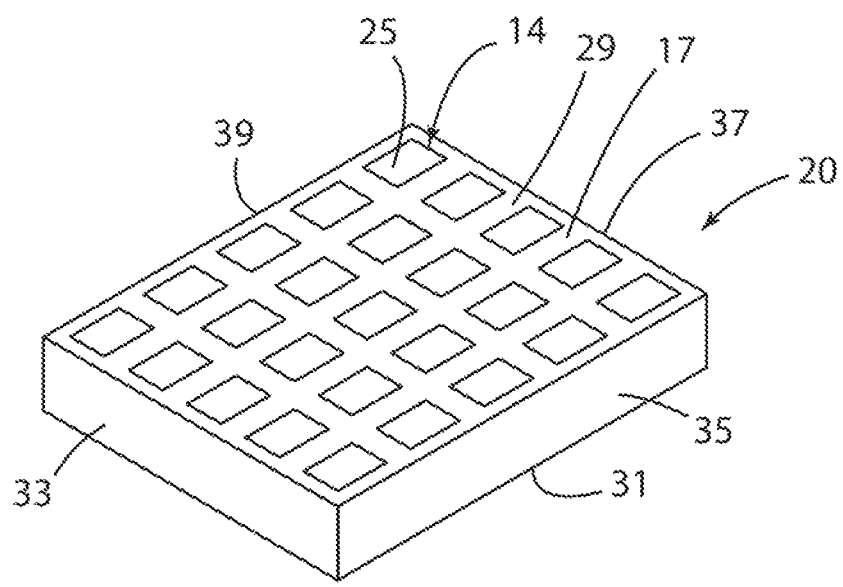
FIG. 3 is an enlarged perspective view of the PZT ceramic wafer of FIG. 2 after filling and encapsulating with epoxy material and grinding off portions of the opposed top and bottom surfaces thereof.
Figure 4:
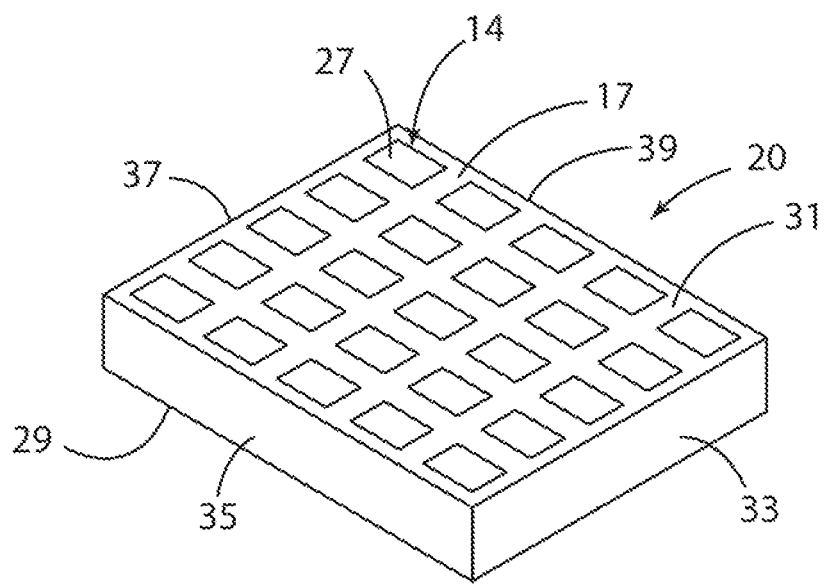
FIG. 4 is an enlarged perspective view of the flip side of the PZT ceramic wafer shown in FIG. 3.

Although also not shown or described herein in any detail, it is understood that the next step in the process of making a composite PZT structure in accordance with the present invention comprises filling all of the open channels 16 in the wafer 10 of FIG. 2 with an epoxy or the like suitable encapsulation material generally designated by the numeral 17 in FIGS. 3 and 4.

After all the channels 16 have been appropriately filled, excess epoxy is removed or scraped from the top and bottom surfaces and sides of the wafer 10 and the epoxy is subsequently cured.

A portion of the top surface of the wafer 10 and the base 12 of wafer 10 are then ground away using a suitable grinding apparatus to the desired pre-poled thickness to create the ground PZT wafer 20 depicted in FIGS. 3 and 4.

Ground PZT wafer 20 is comprised of the plurality of spaced-apart, parallel, elongate individual PZT elements 14 shown in FIG. 2 encapsulated in, and held together by, the layer or coating of epoxy encapsulation material 17 which defines the respective top surface 29, bottom surface 31, and side surfaces 33, 35, 37, and 39 of the ground PZT wafer 20. As shown in FIGS. 3 and 4, each of the individual PZT elements 14 includes respective opposed end surfaces 25 (FIG. 3) and 27 (FIG. 4) which terminate in the opposed top and bottom surfaces 29 (FIG. 3) and 31 (FIG. 4) respectively of the ground PZT wafer 20.

Figure 5:
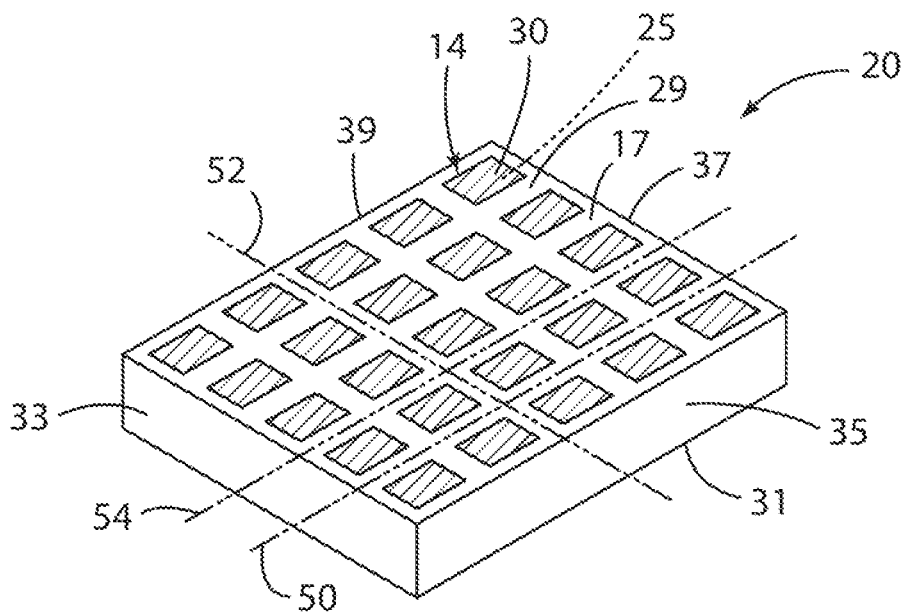
FIG. 5 is an enlarged perspective view of the PZT ceramic wafer of FIG. 3 with a layer of conductive material applied over each of the ends of the individual PZT elements encapsulated therein.
Figure 6:
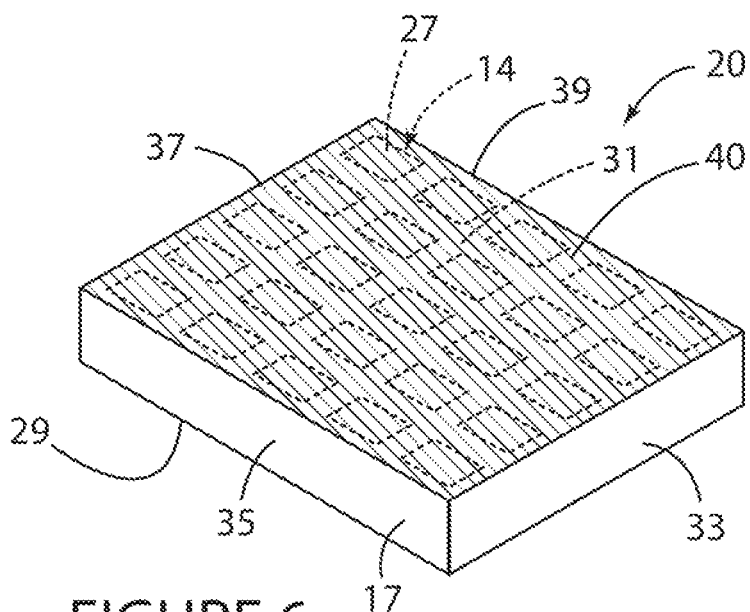
FIG. 6 is an enlarged perspective view of the flip side of the PZT ceramic wafer of FIG. 5 with a layer of conductive material applied to and covering the entire surface thereof.

The method of making the composite PZT structure of the present invention also includes the steps of metallizing the ground PZT wafer 20, i.e., the step of applying/sputtering a layer of conductive metal material to each of the top and bottom surfaces 29 and 31 of the ground PZT wafer 20 as shown in FIGS. 5 and 6.

FIG. 5 depicts the ground PZT wafer 20 with a cover layer of conductive material 30 covering only the end surface 25 (FIG. 3) of each of the PZT elements 14 terminating in the top surface 29 of the ground PZT wafer 20. Although not described in any detail, it is understood that the cover layer of conductive material 30 can be created in several different ways including, but not limited to, the following: covering the entire top surface 29 of the ground PZT wafer 20 with a layer of conductive material and then removing, as by lasing or the like, the regions of the layer of conductive material overlying the layer or regions of epoxy material 17 surrounding the end surface 25 of each of the PZT elements 14; or covering the regions of epoxy material on the top surface 29 of the ground PZT wafer 20 with a mask material and then applying a layer of conductive material over the entire surface 29 followed by the removal of the mask material.

The step described in the paragraph above creates a PZT wafer 20 as shown in FIG. 5 wherein the ends 25 of the respective PZT elements 14 in the PZT wafer 20 are electrically isolated from each other by the surrounding non-conductive regions of epoxy material.

FIG. 6 depicts the opposite or flip side of the PZT wafer 20 shown in FIG. 5 and, more specifically, depicts the continuous layer of conductive material 40 which covers substantially the entire bottom surface 31 of the PZT wafer 20 and thus all the ends 27 of the plurality of PZT elements 14 and the epoxy material 17, thereby grounding all of the ends 27 of the plurality of PZT elements 14 to each other.

Thereafter, and although not shown, it is understood that electrodes are applied to the PZT wafer 20 to pole, and then test, the PZT wafer 20.

Figure 7:
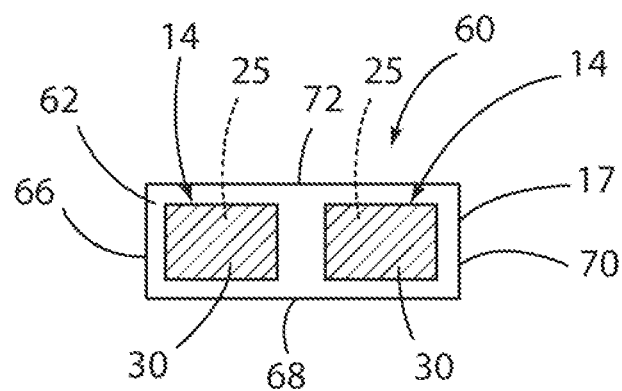
FIG. 7 is an enlarged top plan view of a composite PZT ceramic structure in accordance with the present invention.
Figure 8:
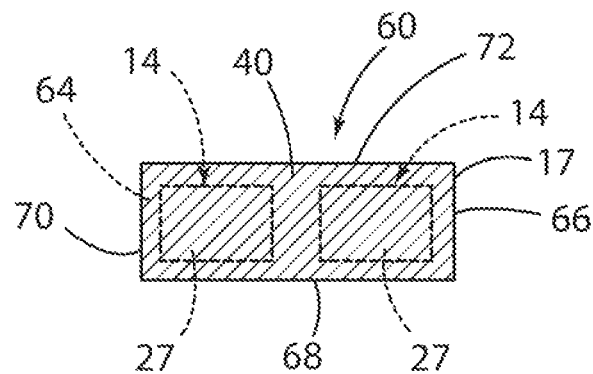
FIG. 8 is an enlarged top plan view of the flip side of the composite PZT ceramic structure shown in FIG. 7.

The PZT wafer 20 is then mounted onto a tape and frame apparatus for the final cutting operation in which any suitable cutting apparatus such as, for example, a dicing blade or laser is used to form a plurality of cuts through the layer 17 of epoxy material including, for example, the first and second normal cuts 50 and 52 shown in FIG. 5 to create and define a composite PZT structure 60 as shown in FIGS. 7 and 8.

The width of the dicing blade or laser determines the width or thickness of the epoxy layer 17 remaining on the outside side surfaces of the PZT structure 60. In an alternate embodiment, and although not shown or described in detail herein, it is understood that the cuts 50 and 52 may be made in a manner and of such a width wherein the layer 17 of encapsulation material is completely cut off.

The composite PZT structure 60 shown in FIGS. 7 and 8 is comprised of opposed top and bottom surfaces 62 and 64 corresponding to the top and bottom surfaces 29 and 31 respectively of the PZT wafer 20; a body which, in the embodiment shown, includes two individual encapsulated PZT elements 14 located and held therein in a spaced-apart and co-linear 1×2 matrix relationship; and a layer of encapsulation material 17 which surrounds the two PZT elements 14 and defines the four side surfaces 66, 68, 70, and 72 of the composite PZT structure 60.

In the alternate embodiment where the layer of encapsulation material 17 surrounding the sides of the PZT elements 14 is completely cut off and removed during the final cutting operation, the resulting composite PZT structure 60 would include only the center layer or region of encapsulation material 17 which is located between, and holds together, the two PZT elements 14.

The end surface 25 (FIG. 7) of each of the PZT elements 14 terminates in the top surface 62 of the PZT structure 60 and the opposed end surface 27 (FIG. 8) of each of the PZT elements 14 terminates in the bottom surface 64 of the PZT structure 60. The end surface 25 of each of the PZT elements 14 is covered with the layer of conductive material 30 (FIG. 7), while the entire opposed surface 64 of the PZT structure 60, including the ends 27 of the PZT elements 14 and the top surface of the layer of epoxy material 17, is covered with the layer of conductive material 40 (FIG. 8). As discussed above with regard to the PZT wafer 20, this creates a PZT structure 60 in which the ends 27 of the two PZT elements 14 terminating in the surface 64 of the PZT structure 60 are coupled and electrically grounded to each other and the respective opposed ends 25 of the two PZT elements 14 terminating in the opposed surface 62 of the PZT structure 60 are electrically isolated from each other.

According to the invention, and although not shown or described herein in any detail, the two PZT elements 14 in the PZT structure 60 are then poled either in opposite directions or in the same direction to create a composite PZT structure 60 in which either one or both of the PZT elements 14 are activated depending upon the desired microactuation application.

While the invention has been taught with specific reference to the embodiment and method described above, someone skilled in the art will recognize that changes can be made in form and detail to the embodiment and the method without departing from the spirit and the scope of the invention. The described embodiment and method is thus to be considered in all respects only as illustrative and not restrictive.

Figure 9:
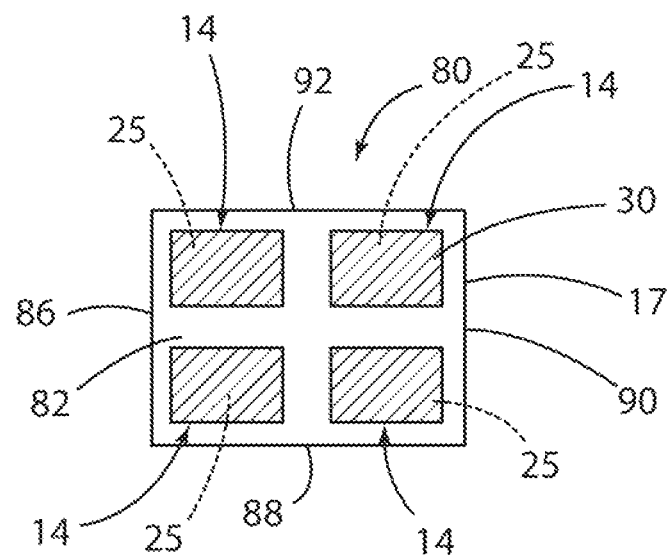
FIG. 9 is an enlarged top plan view of another embodiment of a composite PZT ceramic structure in accordance with the present invention.
Figure 10:
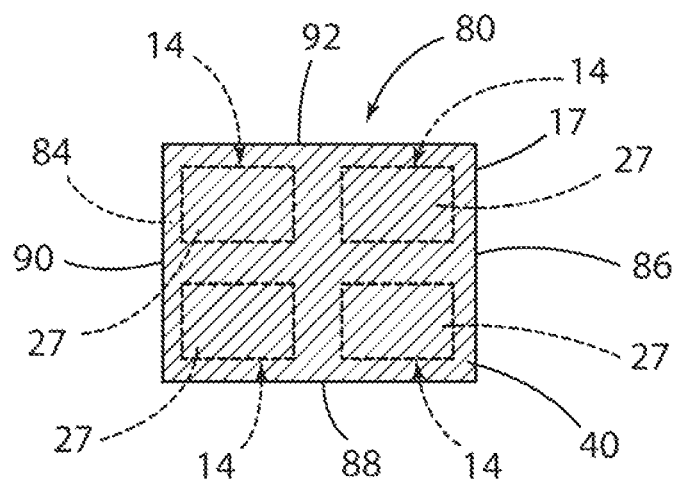
FIG. 10 is an enlarged top plan view of the flip side of the composite PZT ceramic structure shown in FIG. 9.

For example, it is understood that the invention encompasses other composite PZT structures with more than two PZT elements encapsulated therein such as, for example, the 2×2 matrix composite PZT structure 80 shown in FIGS. 9 and 10 which includes four individual PZT elements 14 encapsulated in the body thereof in a spaced-apart 2×2 matrix relationship.

The 2×2 matrix composite PZT structure 80 is created by cutting the PZT wafer 20 (FIG. 5) along the cut lines 52 and 54 shown in FIG. 5 and, in the embodiment shown, the PZT structure 80 includes a top surface 82 (FIG. 9) and a bottom surface 84 (FIG. 10). In the embodiment of FIGS. 9 and 10, the PZT wafer 20 is cut so that a layer of encapsulation material 17 surrounds each of the four PZT elements 14 and defines the four side surfaces 86, 88, 90, and 92 of the PZT structure 80.

In an alternate embodiment not shown herein wherein the final cutting operation involves the step of completely cutting off or removing the layer of encapsulation material 17 surrounding the sides of the four PZT elements 14 in FIG. 5, it is understood that the only layer of encapsulation or epoxy material 17 would be the center cross-shaped layer or region of encapsulation material located between the four PZT elements 14 and holding the four PZT elements 14 together.

The ends 25 (FIG. 9) of the four respective PZT elements 14 encapsulated in the PZT structure 80 terminate in the top surface 82 of the PZT structure 80 and the opposed ends 27 (FIG. 10) of the four respective PZT elements 14 terminate in the bottom surface 84 of the PZT structure 80. Only the ends 25 of the PZT elements 14 terminating in the surface 82 are covered with the layer of conductive material 30 (FIG. 9) to isolate the respective ends 25 of the respective PZT elements 14 from each other. The ends 27 of the four respective PZT elements 14 terminating in the opposed surface 84 of the PZT structure 80 and the encapsulation material 17 are covered with the layer of conductive material 40 (FIG. 10) which covers the entire surface 84 of the PZT structure 80, thus electrically coupling and grounding the ends 27 of the four respective PZT elements 14 together.

Although not shown or described herein in any detail, it is understood that, in the embodiment of FIGS. 9 and 10, the PZT elements 14 can be poled in the same or opposite directions depending upon the desired application and actuation requirements. Thus, for example, the PZT elements 14 can be poled such that only three of the four PZT elements 14 are activated during use depending again upon the specific application.

We claim:

1. A method of making a composite ceramic structure including at least two ceramic elements comprising the steps of:
   a) providing a wafer of ceramic material including opposed first and second surfaces;
   b) making a plurality of cuts through the wafer to form a wafer including a base and a plurality of spaced-apart ceramic elements extending away from the base and defining a plurality of spaced-apart recesses surrounding the plurality of ceramic elements;
   c) filling the plurality of recesses with an encapsulation material;
   d) grinding away a portion of the first and second opposed surfaces of the wafer to expose first and second opposed ends of the plurality of ceramic elements which terminate in the first and second surfaces of the wafer;
   e) covering the first surface of the wafer with a layer of conductive material to ground the first ends of the plurality of ceramic elements;
   f) covering only the second ends of the plurality of ceramic elements with a layer of conductive material to electrically isolate the second ends of the plurality of ceramic elements;
   g) poling the wafer; and
   h) making one or more cuts through the encapsulation material to form the composite ceramic structure.

2. The method of claim 1 wherein step h) includes the step of making two cuts in the wafer to form a composite ceramic structure including two ceramic elements arranged in a 1×2 matrix.

3. The method of claim 1 wherein step h) includes the step of making two cuts in the wafer to form a composite ceramic structure including four ceramic elements arranged in a 2×2 matrix.

4. The method of claim 1 further comprising making one or more cuts through the encapsulation material to remove all of the encapsulation material from the sides of the composite ceramic material.

* * * * *